United States Patent [19]

Sheng

[11] 4,398,056

[45] Aug. 9, 1983

[54] SOLAR CELL WITH REFLECTING GRATING SUBSTRATE

[75] Inventor: Ping Sheng, Westfield, N.J.

[73] Assignee: Exxon Research and Engineering Co., Florham Park, N.J.

[21] Appl. No.: 285,953

[22] Filed: Jul. 23, 1981

[51] Int. Cl.$^3$ .............................................. H01L 31/04
[52] U.S. Cl. ..................................... 136/259; 136/258
[58] Field of Search ............... 136/258 AM, 259, 261, 136/258 PC

[56] References Cited

U.S. PATENT DOCUMENTS 3,973,994 8/1976 Redfield .............................. 136/259
4,328,390 5/1982 Meakin et al. ....................... 136/259

OTHER PUBLICATIONS

J. C. C. Fan et al., "Proposed Design of a:Si:H Solar Cells Using Ultrathin Active Layer to Increase Conversion Efficiency," *Conf. Record, 14th IEEE Photovoltaic Specialists Conf.* (1980), pp. 1070–1073.

J. Müller, "Thin Silicon Film p–i–n Photodiodes with Internal Reflection", *IEEE Trans. Electron Devices*, vol. ED-25, pp. 247–253 (1978).

*Primary Examiner*—Aaron Weisstuch
*Attorney, Agent, or Firm*—Ronald D. Hantman

[57] ABSTRACT

A solar cell which includes a thin layer of active material bounded on the side toward the incident light with an antireflection coating and bounded on the other side by a reflecting diffraction grating to internally reflect the incident light back into the active material.

9 Claims, 1 Drawing Figure

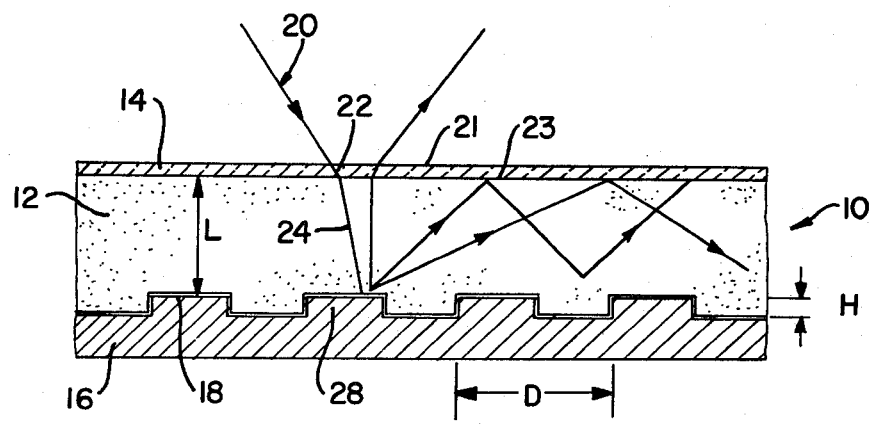

4,398,056

SOLAR CELL WITH REFLECTING GRATING SUBSTRATE

BACKGROUND OF THE INVENTION

The present invention concerns solar cells. In particular, the present invention is a solar cell whose absorption of incident solar light is enhanced in a range of light wavelengths where the intrinsic absorption by the semiconductor is especially weak.

Many of the materials used for solar cells, such as silicon, require a thick active layer because of low absorption of incident light. In particular, silicon has low solar absorptance in the infrared and far-infrared. However, such thickness requirements impose severe purity constraints on the material. This follows because the purity of the active material determines the lifetime of the electron-hole pair that is generated by the absorbed sunlight. The lifetime of the generated pair is proportional to the diffusion length. The diffusion length is the average length a generated carrier can travel before it recombines. Since the cell must be thick to allow for absorption of the incident sunlight, the diffusion length must be of the order of the thickness of the cell to allow for the generated pair to contribute to the electric current generated by the cell. This, in turn, requires high purity active material.

It is desirable to reduce the thickness of the active material for several reasons. First, a thin layer would reduce the amount and, therefore, the cost of the active material. Second, a thin layer would allow for a reduction in the diffusion length of the generated carriers. Shorter diffusion lengths allow for a reduction in the purity of the active material as discussed above.

SUMMARY OF THE INVENTION

The invention is a solar cell including an active layer of semiconductor material, an anti-reflection coating on the surface toward the incident light of the silicon layer and a reflecting diffraction grating fixed to the other surface of the silicon layer.

In a preferred embodiment, the active layer is silicon and the diffraction grating is silver.

BRIEF DESCRIPTION OF THE DRAWING

The sole FIGURE is a cross-sectional view of the invention.

DETAILED DESCRIPTION

For purposes of description, the present invention shall be illustrated and described with respect to a solar cell whose active material is silicon. However, it is to be understood that other active materials may be used.

The present invention is a solar cell in which some of the incident light that enters the cell is converted into "guided waves" inside the active material. These guided waves travel horizontally parallel to the silicon film surface. These guided waves travel on the average, a distance inside the silicon much longer than the thickness of the silicon. This allows the thickness of the silicon to be reduced so that the active material is but a thin film. The conversion of the incident light to waves travelling horizontal to the cell surface is accomplished by a diffraction grating fixed to one surface of the active material.

Referring to the FIGURE, the basic elements of the present invention are shown. The solar cell 10 includes an active layer of silicon semiconductor material 12 of thickness L. The silicon layer may be crystalline, polycrystalline, or amorphous. The surface of the silicon film 12 toward the incident light is coated with an antireflection coating 14 to reduce reflection loss of the incident light. Such coatings include an evaporated layer of $SnO_2$ or $ZrO_2$ of the order of 0.07 $\mu$m thick. The surface of the silicon film 12 opposite the incident light is fixed to a reflecting diffraction grating 16. The diffraction grating 16 is coated on the side 18 toward the incident light 20 with a layer of silver or aluminum. However, a preferred material is silver. The silicon film 12 is then deposited on the reflectorized grating by either evaporation or other thin film deposition methods. When sunlight enters the solar cell at some arbitrary angle, the light is refracted due to the higher index of refraction of the antireflection coating and silicon according to Snell's Law $$N \sin i = n \sin r,$$

Where
N = index of refraction of first medium
n = index of refraction of second medium
i = angle with respect to the vertical of incident light
r = angle with respect to the vertical of light in second medium.

The incoming light ray 20 is refracted at each interface as it enters the solar cell. At the air-antireflection coating interface 21, the light ray 22 is refracted toward the vertical in accordance with Snell's Law since the index of refraction of the coating exceeds that of air. Again at the antireflection coating-silicon interface 23, the light ray 24 is refracted toward the vertical because the index of refraction of silicon is greater than that of the antireflection coating.

Since the silicon layer 12 is a thin film, the light (with wavelength in the red or infrared) will most likely cross the silicon film 12 with small absorptance. As the light strikes the reflecting diffraction grating, it is diffracted into various diffraction orders labeled as 0, 1, and 2 etc.

The diffraction grating 16 is a square-wave arrangement, preferably coated with silver on surface 18, which serves as the substrate on which the silicon film is deposited. This substrate may be any material for which one can easily write a grating, for example chromium. In addition, the grating 16 may be supported by glass or quartz to add strength to the structure. The diffraction angles for the various orders are determined by the periodicity of the grating, D. The intensity distribution between various orders is determined by the grating, depth H of the teeth 28, see e.g., "Theoretical Considerations of Optical Diffraction from RCA Video Disc Signals", by Ping Sheng, *RCA Review*, September 1978, Vol. 39, No. 3. Some of the diffraction orders, such as 0, will be able to exit from the silicon layer. However, many of the diffracted orders, such as 1 and 2, will strike the top interface at angles with respect to the vertical greater than the critical angle, C, and therefore will be totally reflected.

The critical angle C is determined by the following formula:

$$\sin C = 1/N_{silicon},$$

when it can be assumed that the index of refraction for air is 1 and $N_{silicon}$ is the index of refraction of silicon. The anti-reflection coating has no net effect on the critical angle.

The trapped diffracted orders e.g. 1 and 2 form the "guided modes" inside the silicon layer. Of course, when the totally reflected light hits the grating again, some of it will be diffracted out of the silicon layer.

As discussed above, the mechanism for mode confinement of the incident light is that the diffracted light strike the top interface with an angle greater than the critical angle. However, all rays that exceed the critical angle cannot propagate in the silicon layer. It is well known that for a given wavelength only rays that intersect the surface at certain angles can be confined between two parallel surfaces. Therefore, only these rays can become "guided modes"; see e.g., Theory of Dielectric Optical Waveguides, Dietrich Marcuse, Academic Press, 1974.

The final equilibrium partition of the light energy is governed by the parameters $\lambda/D$, H, and L where $\lambda$ is the wavelength of the incident light, D is the periodicity of grating, H is the depth of the teeth 28 and L is the thickness of the silicon film 12. These parameters are chosen due to the following considerations. The absorption constant of silicon for light with $\lambda \leq 0.55$ $\mu$m is large and, therefore no absorption enhancement is needed. In addition, light with $\lambda \geq 1.1$ $\mu$m is below the band gap energy for silicon and cannot generate electron-hole pairs. Therefore, it is only necessary to increase the absorption of the light spectrum between $\lambda = 0.55$ $\mu$m and $\lambda = 1.1$ $\mu$m. The parameters of the cell and grating are chosen so as to maximize the coupling of that portion of the light spectrum between $\lambda = 0.55$ $\mu$m and $\lambda = 1.1$ $\mu$m and the conversion of incident light to horizontally-traveling guided modes.

It is to be emphasized that the parameters D and H are determined to optimize light absorption after the active material and its thickness, L, and the grating coating material are chosen. The dielectric constant of the coating material alters the diffraction of the incident light. The following examples illustrate the present invention.

Example 1

A solar cell can be made according to the present invention in which the active material is polycrystalline silicon with L=1 $\mu$m, the optimal grating parameters are D=0.4 $\mu$m and H=0.075 $\mu$m. For such grating parameters and for a diffuse sky, the absorption of solar lights at $\lambda = 1$ $\mu$m is enhanced from 0.8% for no grating (flat silver surface) to about 20% for grating with optimal parameters. D and H given above are for optimum performance. However, D may vary between 0.35 $\mu$m and 0.45 $\mu$m and H between 0.065 $\mu$m and 0.085 $\mu$m and still give satisfactory results.

Example 2

In another application of the invention, a solar cell with a two-dimensional rectangular cross-hatched grating with D=0.25 $\mu$m and H$\approx$0.08 $\mu$m can be constructed by putting the grating on a metal substrate, such as Cr, by electron beam lithography. The grating substrate is then coated with a 500 Å-thick Ag layer by evaporation. An active layer of 0.5 $\mu$m amorphous Si can then be deposited on top of this prepared grating substrate by the usual glow discharge of SiH$_4$. A 700 Å layer of TiO$_2$, or a 550 Å of ZrO$_2$, is evaporated on top of the amorphous Si to act as an anti-reflection coating. As in Example 1 above, D may vary between 0.25 $\mu$m and 0.35 $\mu$m and H may vary by $\pm$100 A and still achieve satisfactory results.

What is claimed is:

1. A solar cell comprising:
   (a) a rectangular diffraction grating coated with a layer of reflecting material on its grating surface; and
   (b) an active layer of semiconductor material formed on said layer of reflecting material; wherein said diffraction grating has a groove periodicity and depth such that enhancement of absorption of incident light within a desired wavelength range is optimized with respect to the index of refraction and the thickness of the active material and dielectric constant of said reflecting material.

2. The solar cell of claim 1, wherein said layer of active material is silicon.

3. The solar cell of claim 2 wherein said reflecting material is silver.

4. The solar cell of claim 2 wherein said desired wavelength range is 0.55 $\mu$m and 1.1 $\mu$m.

5. The solar cell of claim 1 wherein said reflecting material is silver or aluminum.

6. The solar cell of claim 1 wherein said active layer is polycrystalline silicon, said reflecting material is silver, the thickness of said active layer is about 1 $\mu$m, said period of said grating has a value between 0.35 $\mu$m and 0.45 $\mu$m, and said depth has a value between 0.065 $\mu$m and 0.085 $\mu$m.

7. The solar cell of claim 1 wherein said diffraction grating is a two-dimensional rectangular array.

8. The solar cell of claim 7 wherein said active layer is amorphous silicon of thickness about 0.5 $\mu$m, said reflecting layer is silver, said period of said grating has a value between 0.25 $\mu$m and 0.35 $\mu$m and said depth of said grating has a value between 0.07 $\mu$m and 0.09 $\mu$m.

9. The solar cell of claim 1 wherein said diffraction grating is a square-wave diffraction grating.

* * * * *